US009780194B1

(12) United States Patent
Balakrishnan et al.

(10) Patent No.: US 9,780,194 B1
(45) Date of Patent: Oct. 3, 2017

(54) VERTICAL TRANSISTOR STRUCTURE WITH REDUCED PARASITIC GATE CAPACITANCE

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/082,131

(22) Filed: Mar. 28, 2016

(51) Int. Cl.
*H01L 29/66* (2006.01)
*H01L 29/78* (2006.01)
*H01L 29/49* (2006.01)

(52) U.S. Cl.
CPC ...... *H01L 29/6656* (2013.01); *H01L 29/4966* (2013.01); *H01L 29/66545* (2013.01); *H01L 29/66666* (2013.01); *H01L 29/7827* (2013.01)

(58) Field of Classification Search
CPC ............. H01L 29/6656; H01L 29/7827; H01L 29/66545; H01L 29/66666; H01L 29/4966
See application file for complete search history.

(56) References Cited

U.S. PATENT DOCUMENTS

| 6,355,563 | B1* | 3/2002 | Cha ................... H01L 21/76802 257/E21.576 |
| 8,164,146 | B2* | 4/2012 | Lung ..................... B82Y 10/00 257/413 |
| 9,443,982 | B1* | 9/2016 | Balakrishnan .... H01L 29/66742 |
| 2007/0166914 | A1* | 7/2007 | Chen ....................... H01L 21/84 438/243 |
| 2010/0301402 | A1* | 12/2010 | Masuoka .......... H01L 21/26586 257/288 |
| 2011/0303985 | A1* | 12/2011 | Masuoka ................ H01L 21/84 257/369 |

(Continued)

OTHER PUBLICATIONS

Karthik Balakrishnan, et al.; "Channel-Last Replacement Metal-Gate Vertical Field Effect Transistor"; U.S. Appl. No. 15/149,282, filed May 9, 2016.

(Continued)

*Primary Examiner* — Jarrett Stark
(74) *Attorney, Agent, or Firm* — Cantor Colburn LLP; Louis Percello

(57) ABSTRACT

A method of forming a gate spacer in a vertical transistor includes depositing a gate spacer layer on a source layer and a sacrificial gate material on the gate spacer layer; etching a trench through the sacrificial gate material and the gate spacer and forming an epitaxial channel within the trench; removing a portion of the sacrificial gate material to expose a portion of the gate spacer layer and leave the sacrificial gate material arranged on sidewalls of the channel; depositing an ultra-low-k spacer material on the gate spacer layer such that the ultra-low-k spacer material contacts a sidewall of the sacrificial gate material; and removing remaining portions of the sacrificial gate material and replacing the sacrificial gate material with a metal gate.

3 Claims, 20 Drawing Sheets

(56) References Cited

U.S. PATENT DOCUMENTS

| | | | |
|---|---|---|---|
| 2015/0129831 A1* | 5/2015 | Colinge | H01L 29/0676 257/9 |
| 2016/0049480 A1* | 2/2016 | Chang | H01L 29/41741 257/369 |
| 2016/0293756 A1* | 10/2016 | Liu | H01L 29/7827 |

OTHER PUBLICATIONS

List of IBM Patents or Patent Applications Treated As Related—Date Filed: May 11, 2016; 1 page.

Karthik Balakrishnan, et al.; "Channel-Last Replacement Metal-Gate Vertical Field Effect Transistor"; U.S. Appl. No. 14/970,977, filed Dec. 16, 2015.

Karthik Balakrishnan, et al.; "Top Metal Contact for Vertical Transistor Structures"; U.S. Appl. No. 15/082,150, filed Mar. 28, 2016.

Karthik Balakrishnan, et al.; "Vertical Transistors With Reduced Bottom Electrode Series Resistance"; U.S. Appl. No. 15/082,142, filed Mar. 28, 2016.

List of IBM Patents or Patent Applications Treated As Related—Date Filed: Mar. 28, 2016; 1 page.

\* cited by examiner

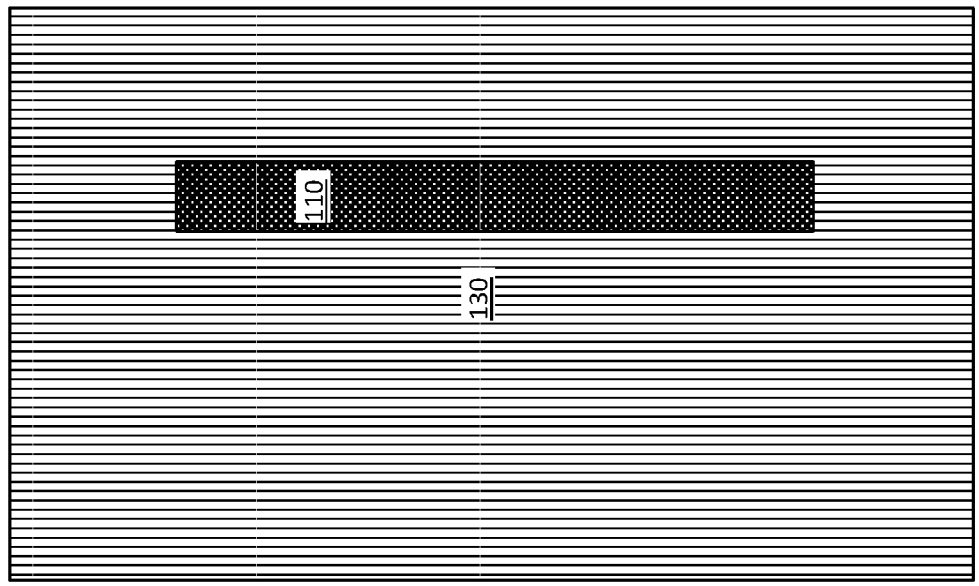
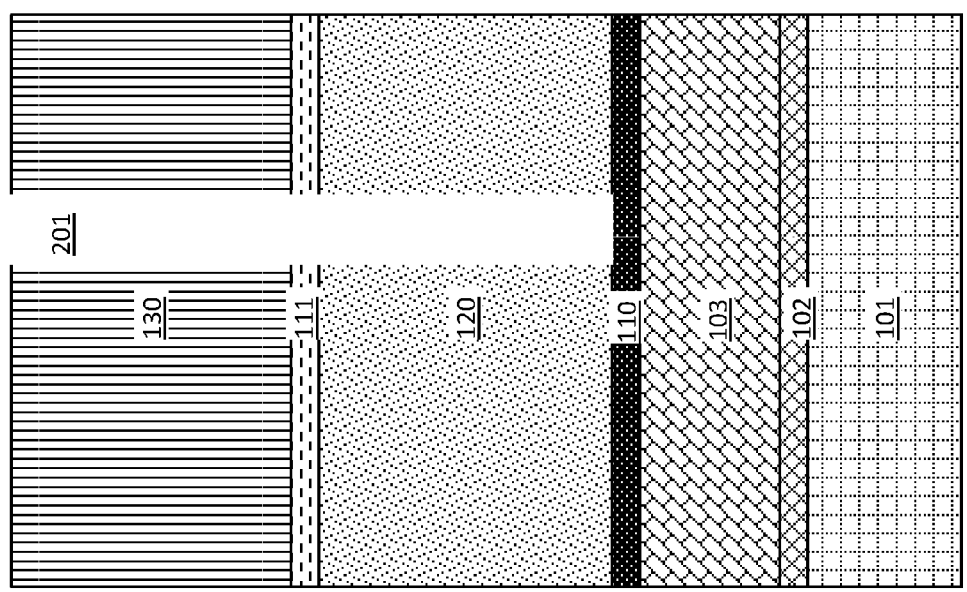
FIG. 2B
FIG. 2A

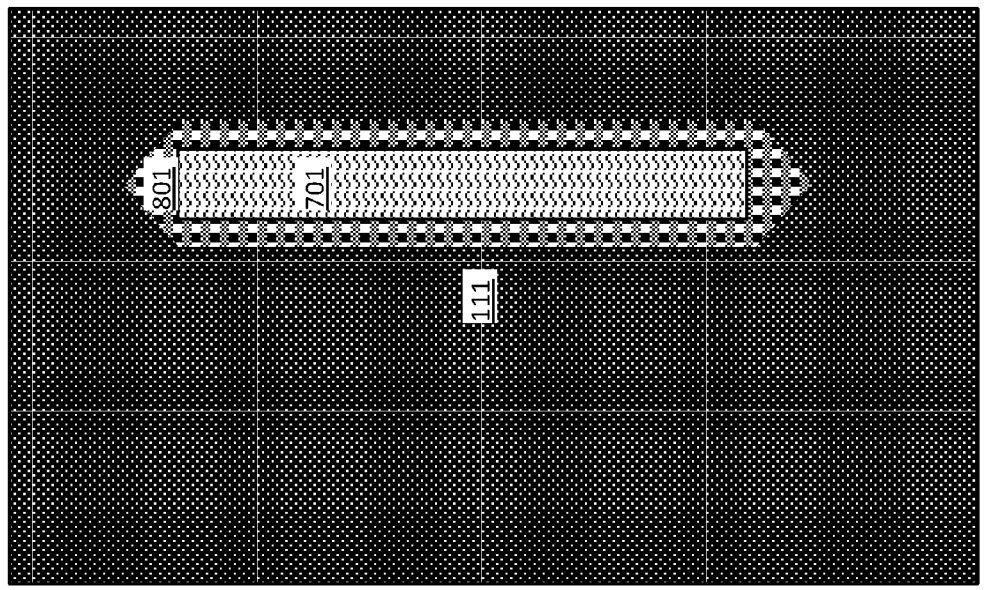
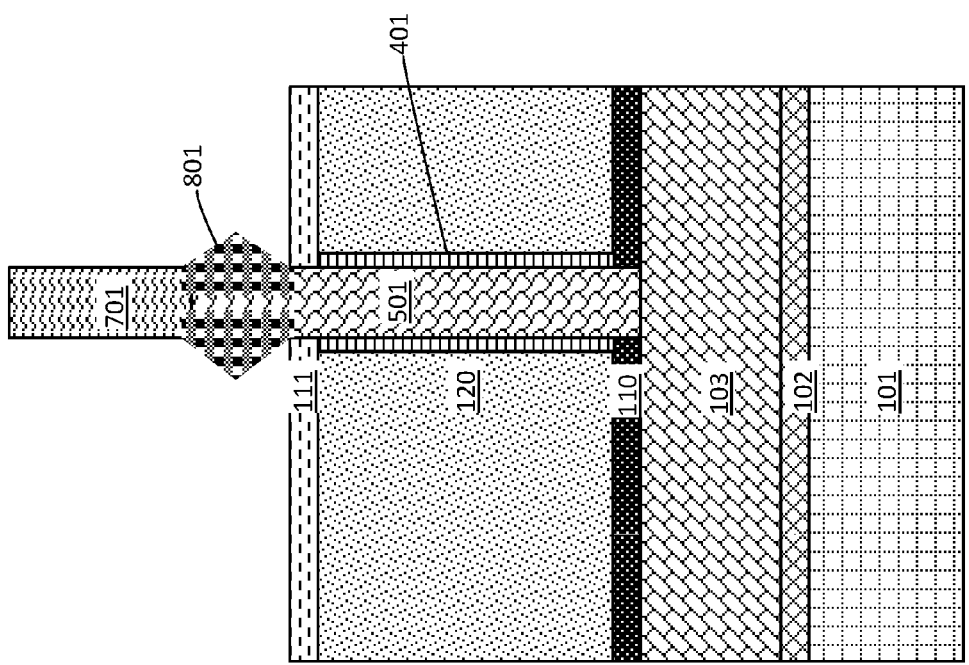
FIG. 8B
FIG. 8A

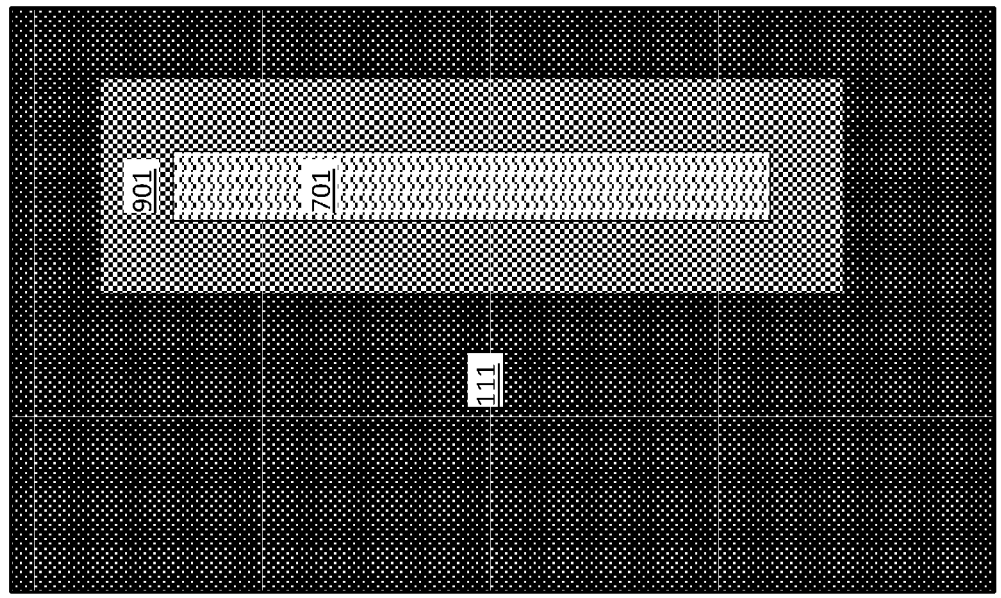
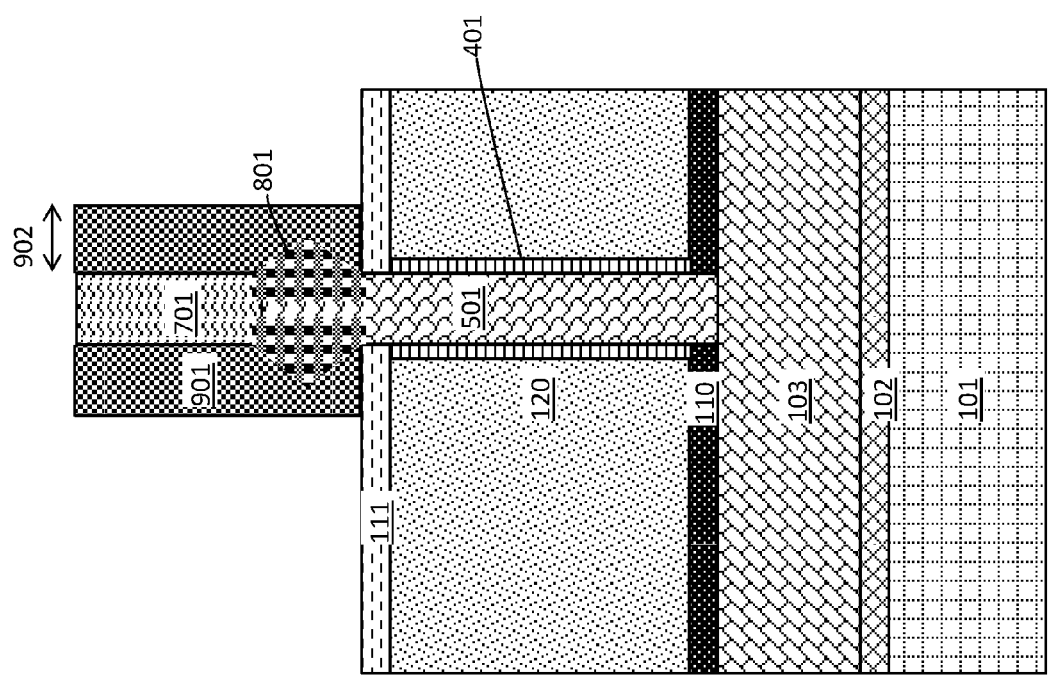

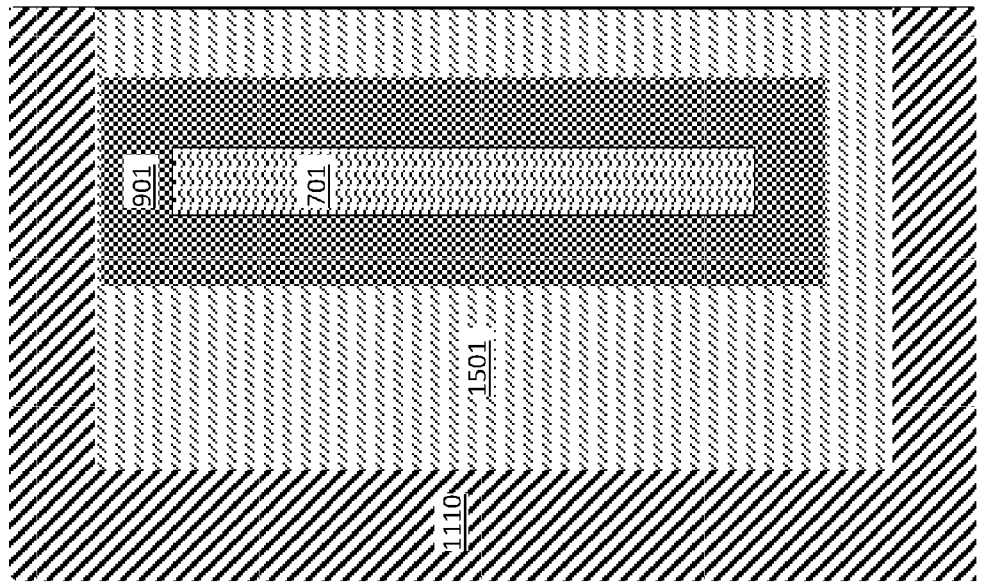
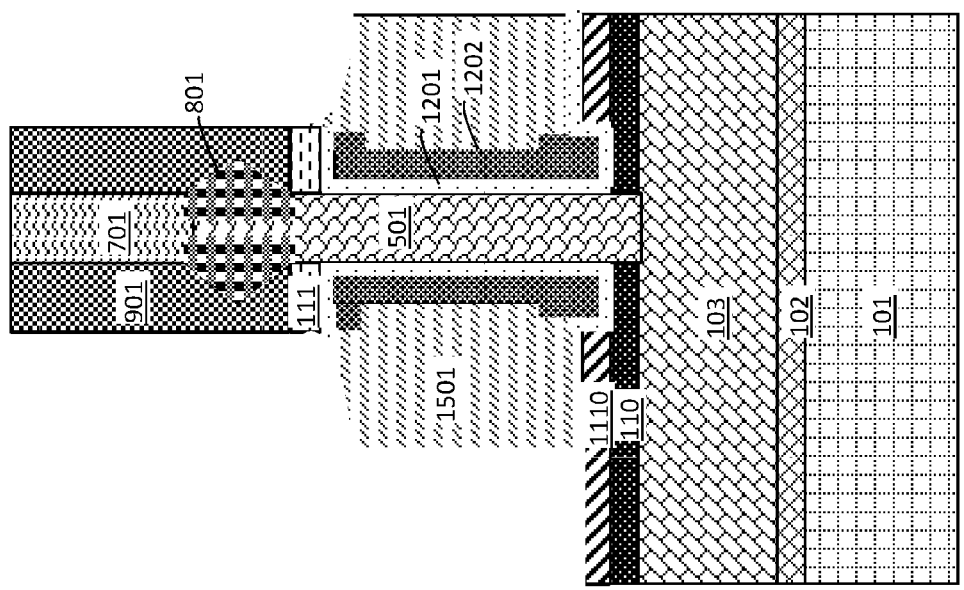
FIG. 16B
FIG. 16A

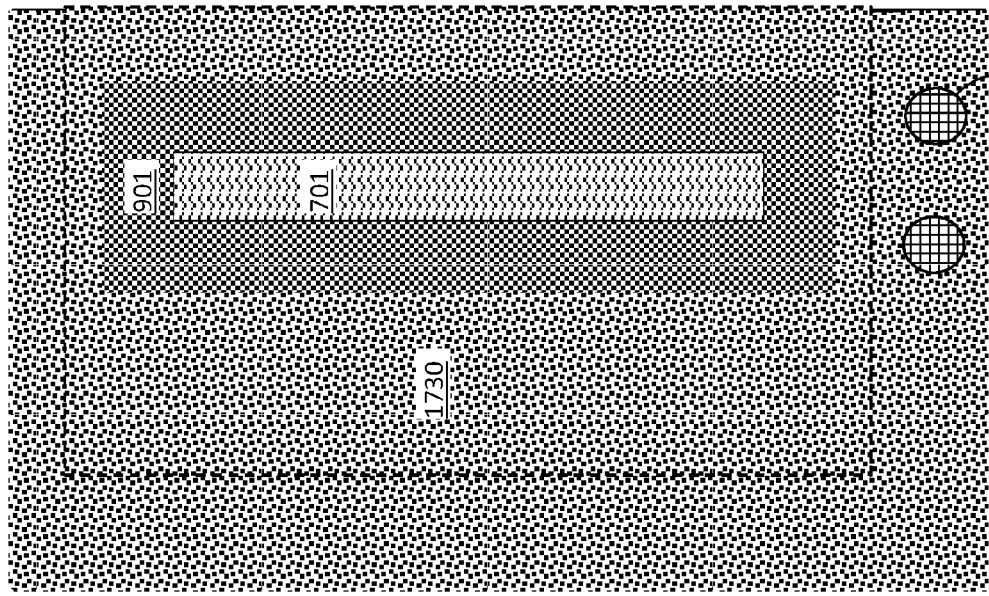
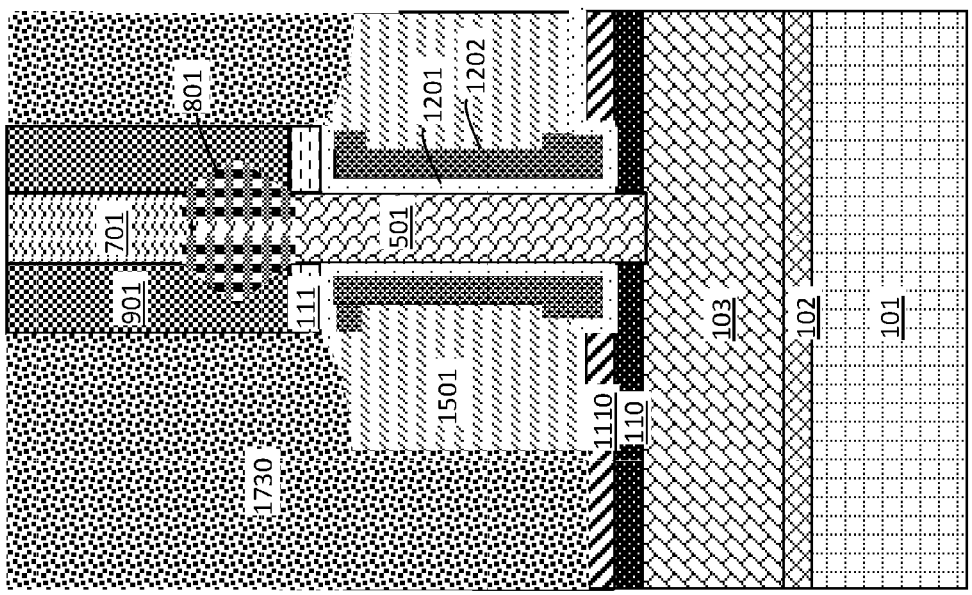
FIG. 18B
FIG. 18A

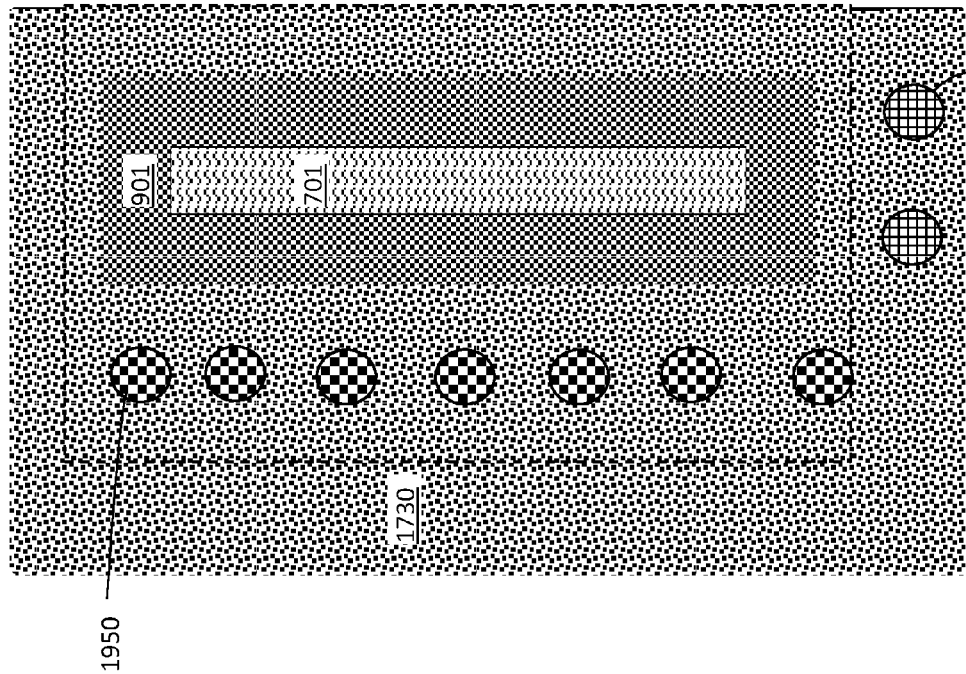
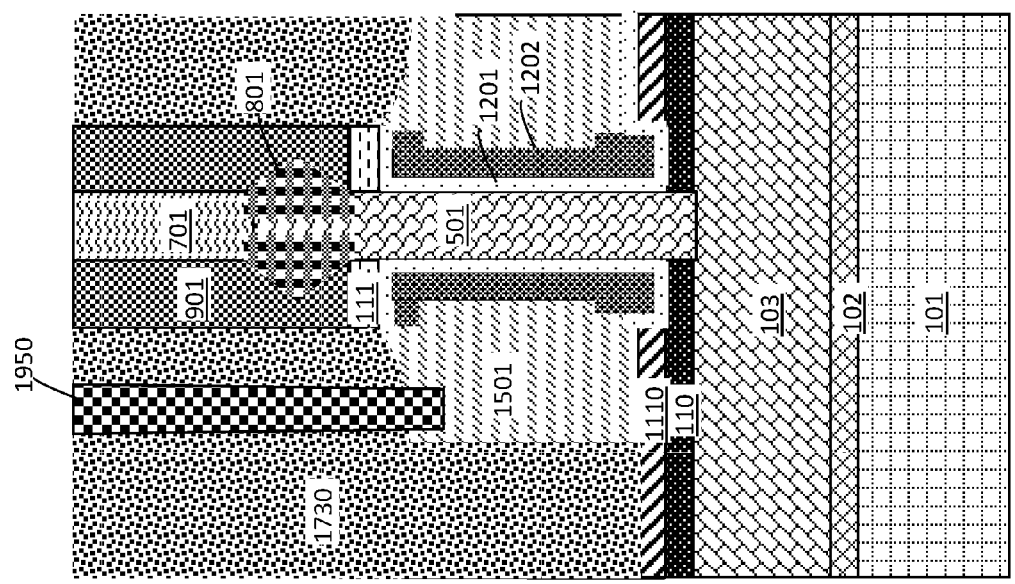
FIG. 19B
FIG. 19A

VERTICAL TRANSISTOR STRUCTURE WITH REDUCED PARASITIC GATE CAPACITANCE

BACKGROUND

The present invention relates to complementary metal oxide semiconductor (CMOS) technology, and more specifically, to vertical transistor semiconductor devices.

CMOS is used for constructing integrated circuits. CMOS technology is used in microprocessors, microcontrollers, static random access memory (RAM), and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

As MOSFETs are scaled to smaller dimensions, various designs and techniques are employed to improve device performance. Vertical transistors, in which source/drain regions are arranged on opposing ends of a vertical channel region, are attractive candidates for scaling to smaller dimensions. Vertical transistors may provide higher density scaling and allow for relaxed gate lengths to better control device electrostatics, without sacrificing the gate contact pitch size.

SUMMARY

According to an embodiment, a method of forming a gate spacer in a vertical transistor includes depositing a gate spacer layer on a source layer and a sacrificial gate material on the gate spacer layer; etching a trench through the sacrificial gate material and the gate spacer and forming an epitaxial channel within the trench; removing a portion of the sacrificial gate material to expose a portion of the gate spacer layer and leave the sacrificial gate material arranged on sidewalls of the channel; depositing an ultra-low-k spacer material on the gate spacer layer such that the ultra-low-k spacer material contacts a sidewall of the sacrificial gate material; and removing remaining portions of the sacrificial gate material and replacing the sacrificial gate material with a metal gate.

According to another embodiment, a method of forming a gate spacer in a vertical transistor includes depositing a gate spacer layer on a source layer and a sacrificial gate material on the gate spacer layer; etching a trench through the sacrificial material and the gate spacer layer to the source layer and forming a channel within the trench; removing a portion of the sacrificial gate material to expose a portion of the gate spacer layer and leave the sacrificial gate material layer arranged on sidewalls of the channel; depositing an ultra-low-k spacer material on the gate spacer layer such that the ultra-low-k spacer material contacts a sidewall of the sacrificial gate material layer; removing remaining portions of the sacrificial gate material layer to form a recess within the ultra-low-k spacer material adjacent to the channel; and depositing a gate stack to form a gate that is arranged around the channel and within the recess.

Yet, according to another embodiment, a vertical transistor includes a source layer arranged on a substrate; a gate spacer layer arranged on the source layer; an ultra-low-k spacer layer arranged on the gate spacer layer; a channel extending vertically from the source layer through the gate spacer layer and the ultra-low-k spacer layer to a drain; a recess formed within the ultra-low-k spacer layer that is adjacent to the channel; and a gate arranged on the ultra-low-k spacer layer and within the recess.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A-20B illustrate exemplary methods of making a semiconductor device according to embodiments, in which:

FIGS. 1A and 1B are a cross-sectional side view and a top view, respectively, of a dummy gate and dielectric capping layer arranged on a substrate;

FIGS. 2A and 2B are a cross-sectional side view and a top view, respectively, after forming a trench through the dielectric capping layer and the dummy gate to expose the first spacer;

FIGS. 8A and 8B are a cross-sectional side view and a top view, respectively, after removing the dielectric capping layer and forming an epitaxial growth on the channel region to form a drain;

FIGS. 9A and 9B are a cross-sectional side view and a top view, respectively, after depositing a spacer on the drain;

FIGS. 16A and 16B are a cross-sectional side view and a top view, respectively, after performing gate lithography and etching to form the gate;

FIGS. 18A and 18B are a cross-sectional side view and a top view, respectively, after forming source contacts;

FIGS. 19A and 19B are a cross-sectional side view and a top view, respectively, after forming gate contacts; and FIGS. 20A and 20B are a cross-sectional side view and a top view, respectively, after forming drain contacts.

DETAILED DESCRIPTION

Although vertical transistors may be used for smaller device scaling, one challenge that may arise in vertical transistors is parasitic gate capacitance. In particular, when a gate is arranged directly on a source layer, and substantially the entire source layer includes a dopant, the gate contact area is larger than in other types of devices, for example, planar devices or FinFET devices. The large gate surface area that contacts the source may lead to undesirable parasitic gate capacitance.

Accordingly, various embodiments provide vertical transistor devices and methods of making vertical transistor devices with reduced parasitic gate capacitance. In embodiments, a thick spacer layer is formed around the bottom area of the gate (see FIGS. 20A and 20B). In one embodiment, a first (bottom) gate spacer is formed on the doped source layer. The first (bottom) gate spacer may be relatively thin. Then, before replacing the dummy gate with the metal gate, an additional ultra-low-k spacer material is deposited onto the thin first gate spacer (see FIGS. 11A and 11B). The additional spacer can be any desired thickness and contacts sidewalls of the work function metal layer of the metal gate, instead of only the bottom surface of the gate (see FIGS. 20A and 20B).

It will be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 1B:
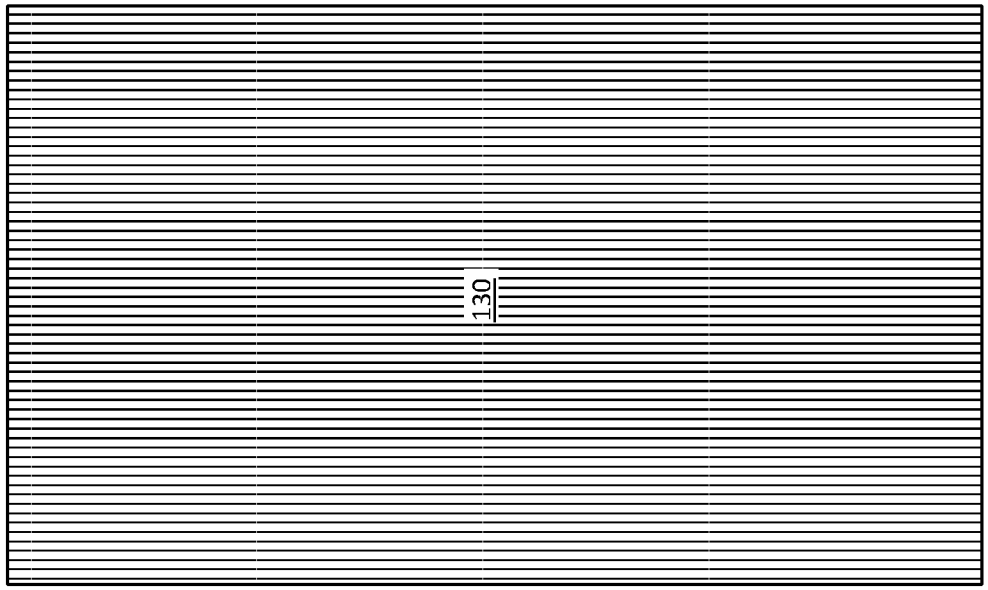
Figure 1A:
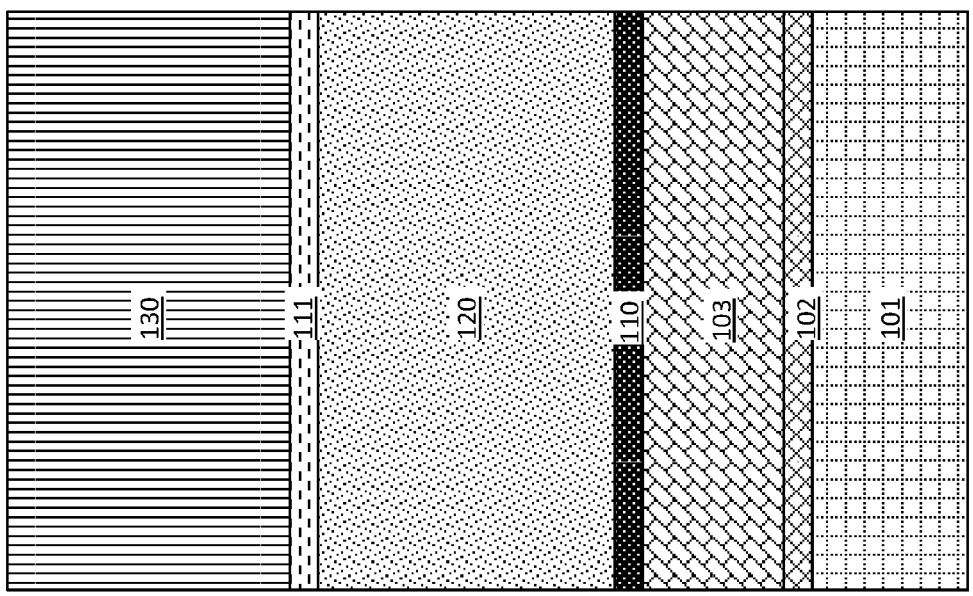

Turning now to the Figures, FIGS. 1A-20B illustrate exemplary methods of making vertical transistor devices according to embodiments. FIGS. 1A and 1B are a cross-sectional side view and a top view, respectively, of a dummy gate 120 and dielectric capping layer 130 arranged on a substrate 101 (bulk substrate). The substrate 101 includes one or more semiconductor materials. Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. In an exemplary embodiment, the substrate 101 includes germanium so that the channel region has both electron and hole mobility properties.

A doped source 103 is arranged on the substrate 101 over a counter-doped layer 102. The doped source 103 and the counter-doped layer 102 are formed on the substrate 101 by incorporating dopants into the substrate 101 or forming an epitaxial growth layer on the substrate 101. The doped source 103 is heavily doped with a dopant, which may be a p-type dopant (e.g., boron or gallium) or an n-type dopant (e.g., phosphorus or arsenic). The counter-doped layer 102 includes a dopant that is different/opposite the dopant in the doped source 103. For example, when the doped source 103 includes a p-type dopant, the counter-doped layer 102 includes an n-type dopant, and when the doped source 103 includes an n-type dopant, the counter-doped layer 102 includes a p-type dopant. The doped source 103 is heavily doped, including a dopant concentration in a range from about $10^{19}$ to about $10^{22}$ atoms/cm$^3$. The thickness of the counter-doped layer 102 may be in a range from about 5 to about 50 nm, or from about 10 to about 20 nm. The thickness of the doped source 103 may be in a range from about 50 to about 250 nm, or from about 100 to about 200 nm.

A dummy gate 120 is disposed on the doped source 103 between a first spacer 110 and a second spacer 111. The first spacer 110 is deposited on the doped source 103, the dummy gate 120 is deposited on the first spacer 110, and the second spacer 111 is deposited on the dummy gate 120. The first spacer 110 and the second spacer 110 may include materials that are the same or different.

The first spacer 110 and second spacer 111 may include an insulating material, for example, silicon dioxide, silicon nitride, SiOCN, or SiBCN. Other non-limiting examples of materials for the first spacer 110 and the second spacer 111 include dielectric oxides (e.g., silicon oxide), dielectric nitrides (e.g., silicon nitride), dielectric oxynitrides, or any combination thereof. In one embodiment, the first spacer 110 includes a material that has a k-value of about 7-8. In other embodiments, the first spacer 110 includes a material with a k-value of at least 7 or at least 8. The first spacer 110 and second spacer 111 materials are deposited by a deposition process, for example, chemical vapor deposition (CVD) or physical vapor deposition (PVD).

The first spacer 110 is formed as a blanket layer over the doped source 103. The first spacer 110 may be thin, depending on the k-value of the material, because the overall thickness of the spacer between the doped source 103 and the gate will be increased by performing an additional spacer material deposition, as described in FIGS. 11A and 11B below. The first spacer 110 may have a thickness in a range from about 3 to about 15 nm. In another embodiment, the first spacer 110 may have a thickness in a range from about 5 to about 10 nm. The second spacer 111 may have a thickness of about 3 to about 15 nm, or of about 5 to about 10 nm.

The dummy gate 120 includes a sacrificial gate material, for example, amorphous silicon (aSi) or polycrystalline silicon (polysilicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial material forming the dummy gate 120 has a thickness of about 8 to about 100, or from about 10 to about 30 nm.

A dielectric capping layer 130 is deposited on the second spacer 111 over the dummy gate 120. Non-limiting examples of materials for the dielectric capping layer 130 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric capping layer 130 has a thickness in a range from about 30 to about 200 nm, or from about 50 to about 100 nm.

FIGS. 2A and 2B are a cross-sectional side view and a top view, respectively, after forming a trench 201 through the dielectric capping layer 130, second spacer 111, and the dummy gate 120 to expose the first spacer 110. The trench 201 extends from a surface of the dielectric capping layer 130 to the first spacer 110, exposing the first spacer 110. The trench 201 is formed by performing an etch process that is selective to (will not substantially remove) the first spacer 110 material. The etch process may be, for example, a reactive ion etch (RIE). Multiple etching processes are performed to form an opening/trench within the structure. For example, a first etching process is performed to remove a portion of the dielectric capping layer 130 selective to the material of the second spacer 111. A second etching process is then performed to remove a portion of the second spacer 111, which underlies the portion of the trench 201 formed from the first etching process, selective to the material of the dummy gate 120. A third etching process is then performed to remove a portion of the dummy gate 120, which underlies the portion of the trench 201 formed from the second etching process, selective to the material of the first spacer 110. The resulting trench 201 extends through a top surface of the dielectric capping layer 130 down to a top surface of an exposed portion of the first spacer 110. The width of the trench 201 may be about 3 to about 20 nm, or about 5 to about 10 nm. The depth of the trench 201 may be about 50 to about 300 nm, or from about 100 to about 200 nm.

Figure 3B:
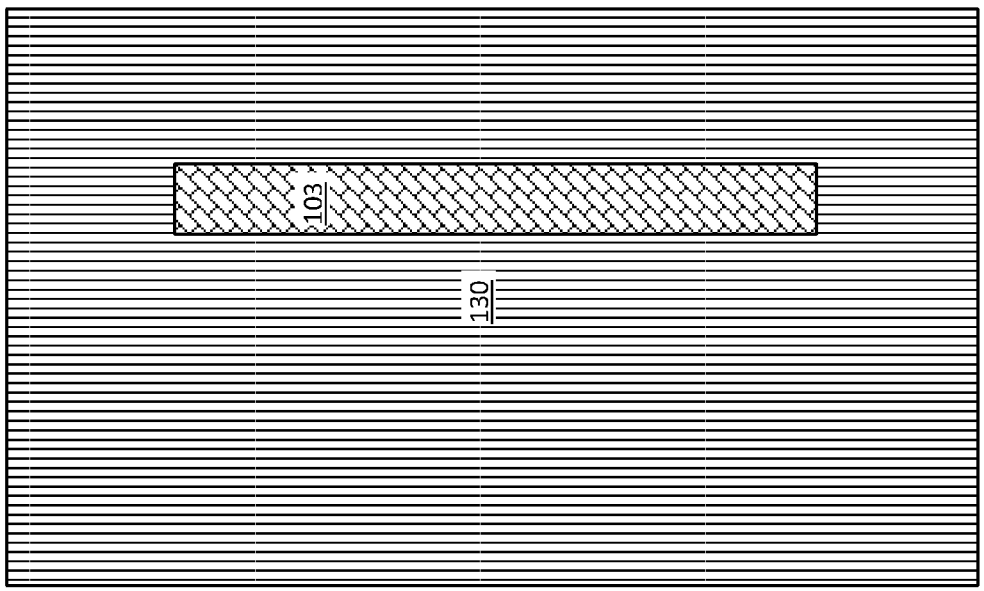
FIGS. 3A and 3B are a cross-sectional side view and a top view, respectively, after etching through the first spacer to expose the doped source.
Figure 3A:
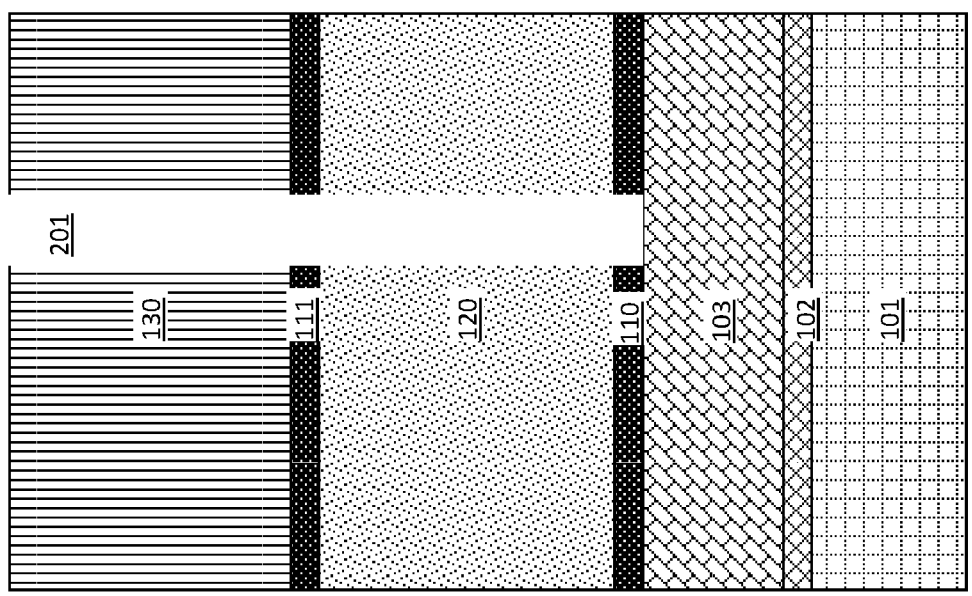

FIGS. 3A and 3B are a cross-sectional side view and a top view, respectively, after etching through the first spacer 110 to expose the doped source 103 and form a self-aligned junction. The first spacer 110 may etched using a process that is selective to (will not substantially remove) the doped source 103 material. The first spacer 110 may be etched by, for example, RIE. The exposed portion of the first spacer 110 is removed by an etching process to expose a portion of the underlying source contact layer. This creates a self-aligned junction because a source extension can be epitaxially grown from the source layer to a top surface of the second spacer 111.

Figure 4B:
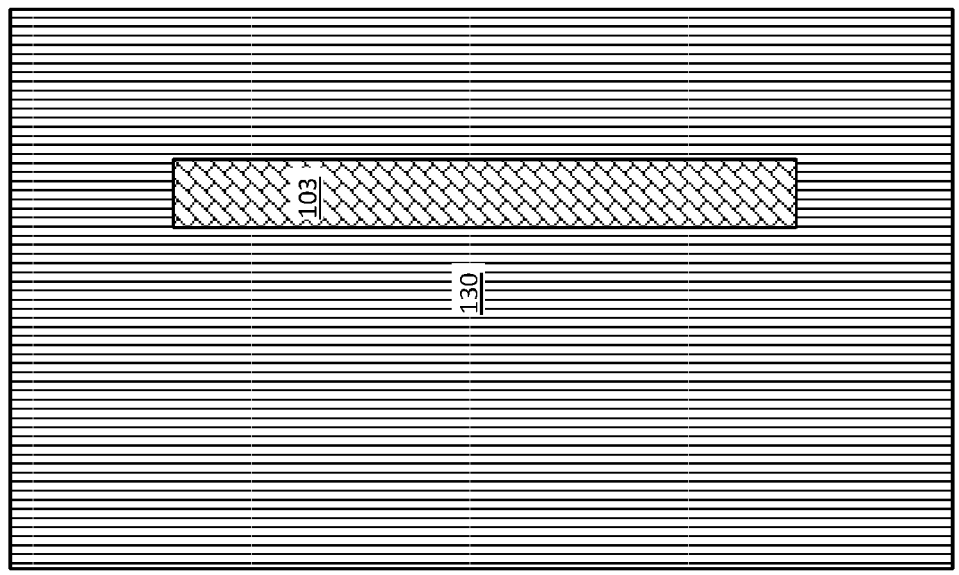
FIGS. 4A and 4B are a cross-sectional side view and a top view, respectively, after oxidizing a portion of the dummy gate sidewall.
Figure 4A:
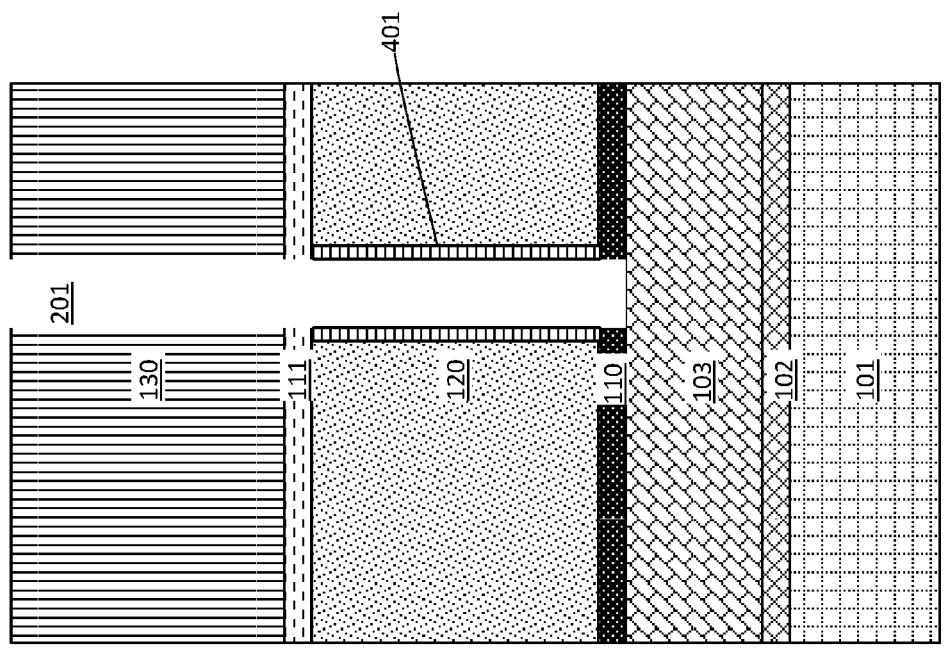

FIGS. 4A and 4B are a cross-sectional side view and a top view, respectively, after oxidizing a portion of the dummy gate 120 sidewall. A thin layer of oxide 401 is formed along the sidewall. The oxidation may be performed by a plasma oxidation process or other oxidation process that forms a thin oxide 401 layer. A portion of the first spacer 110 or the doped source 103 also may be oxidized. Any oxide formed in these regions is removed before performing the epitaxial growth (see FIGS. 5A and 5B).

Figure 5B:
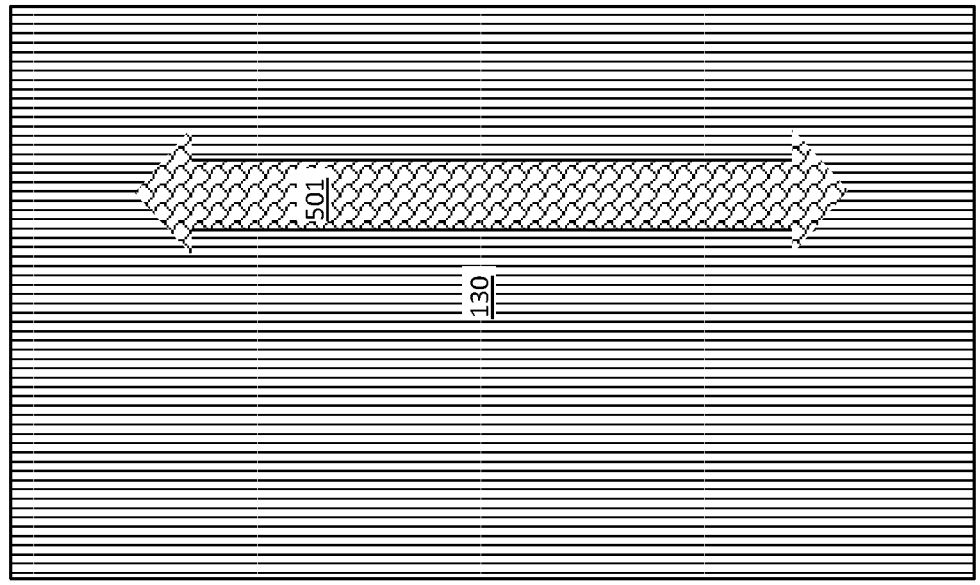
FIGS. 5A and 5B are a cross-sectional side view and a top view, respectively, after growing an epitaxial layer within the trench to from a channel region.
Figure 5A:
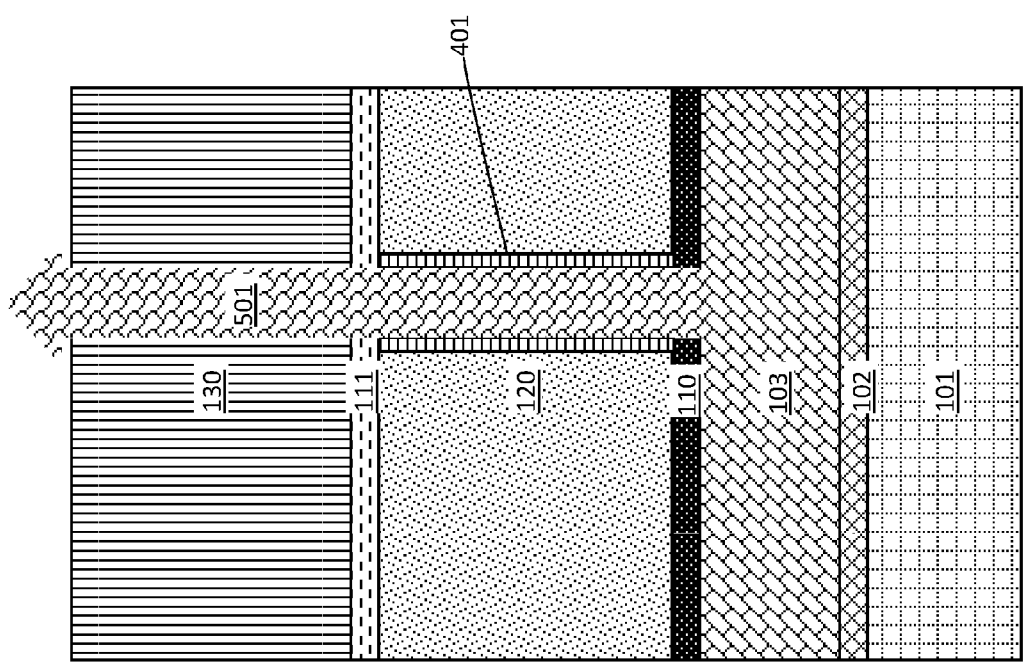

FIGS. 5A and 5B are a cross-sectional side view and a top view, respectively, after growing an epitaxial layer on the doped source 103 to form the epitaxial channel 501 (channel region). The channel 501 extends vertically from the source and through the trench 201 extending through the dummy gate 120, first spacer 110, and second spacer 111. The epitaxial growth includes an epitaxial semiconductor material, and the epitaxial growth and/or deposition processes are selective to forming on semiconductor surface and do not deposit material on other surfaces, such as the oxide 401, first spacer 110, or second spacer 111. The epitaxial growth in the epitaxial channel 501 extends over the dielectric capping layer 130.

The epitaxial channel 501 may be grown using a suitable growth process, for example, chemical vapor deposition (CVD), liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The sources for the epitaxial channel 501 material may be, for example, silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. An epitaxial germanium layer can be deposited from a germanium gas source that is selected from the group consisting of germane, digermane, halogermane, dichlorogermane, trichlorogermane, tetrachlorogermane, and combinations thereof. An epitaxial silicon germanium alloy layer can be formed utilizing a combination of such gas sources. Carrier gases like hydrogen, nitrogen, helium and argon can be used.

Figure 6B:
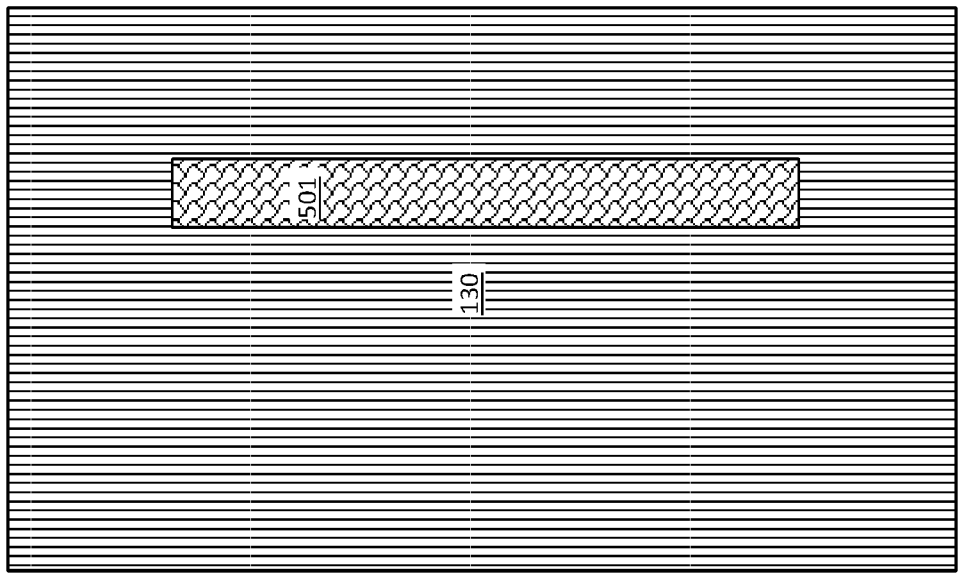
FIGS. 6A and 6B are a cross-sectional side view and a top view, respectively, after planarizing the epitaxial layer.
Figure 6A:
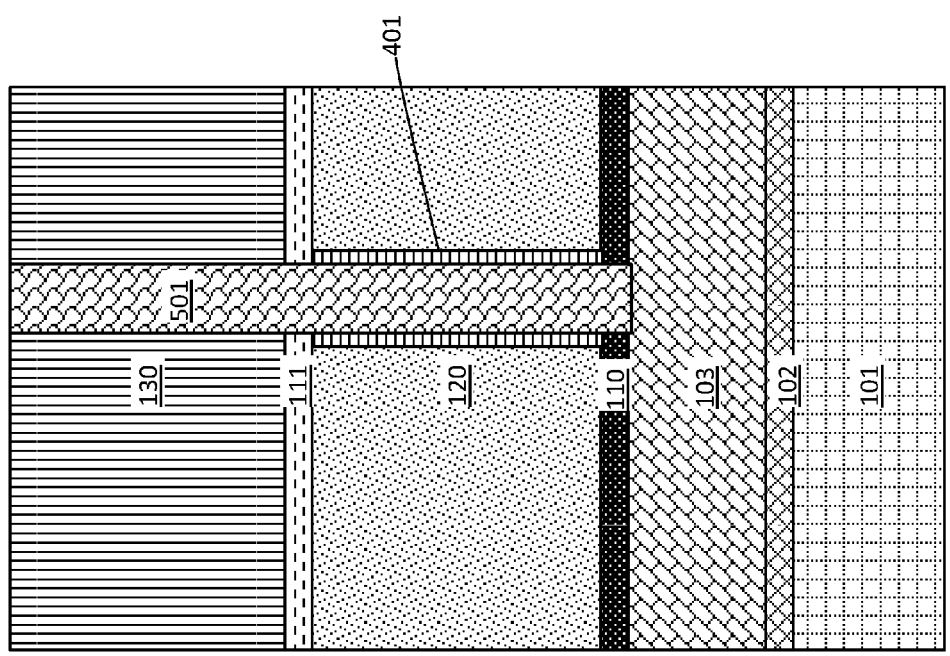

FIGS. 6A and 6B are a cross-sectional side view and a top view, respectively, after planarizing the epitaxial growth in the epitaxial channel 501. The planarization process may be a CMP process. Planarization removes excess epitaxial growth over the dielectric capping layer 130.

Figure 7B:
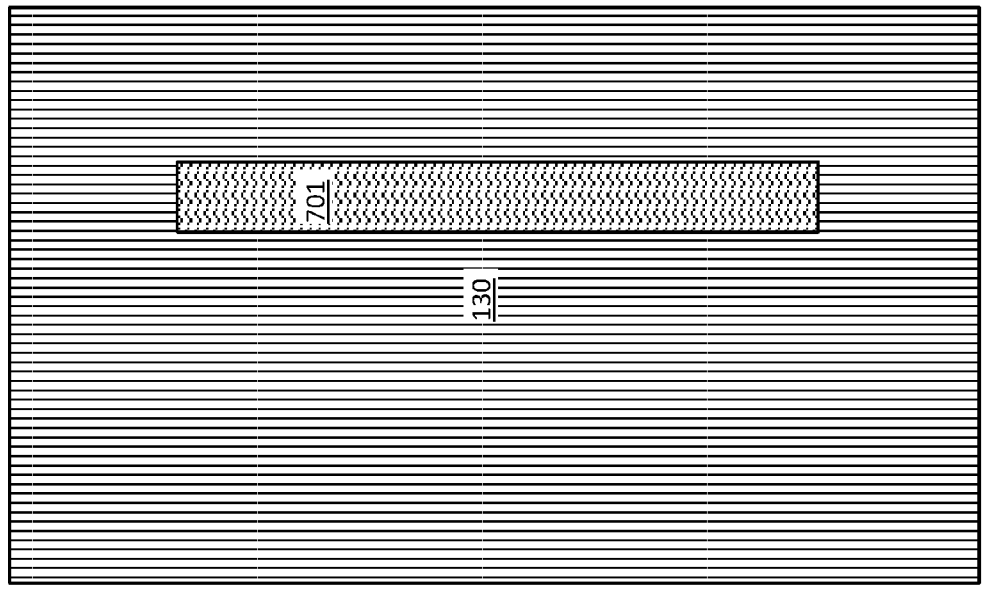
FIGS. 7A and 7B are a cross-sectional side view and a top view, respectively, after partially recessing the epitaxial layer, filling with a dielectric material, and planarizing.
Figure 7A:
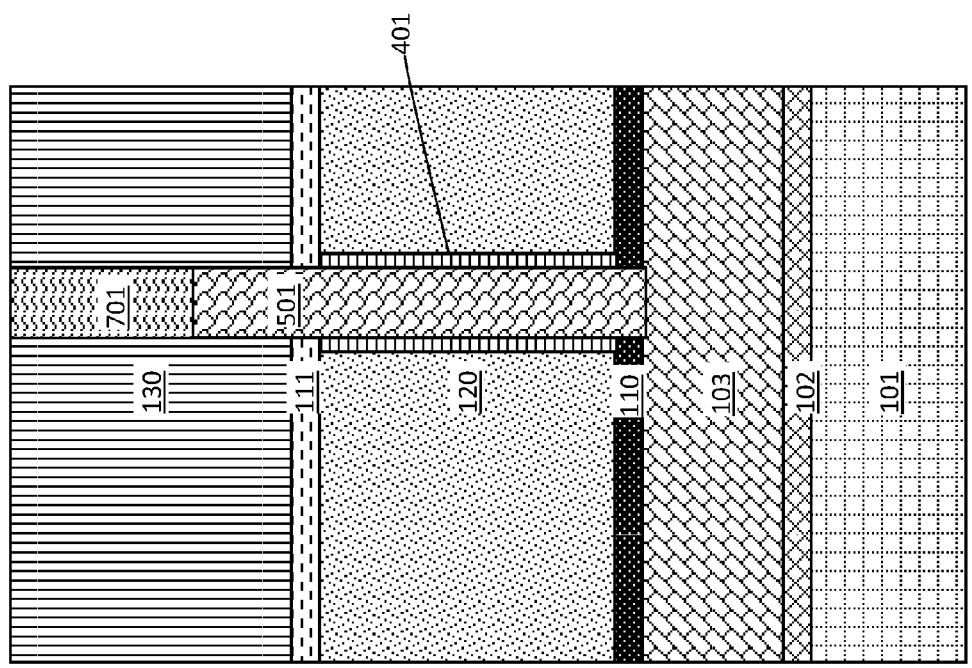

FIGS. 7A and 7B are a cross-sectional side view and a top view, respectively, after partially recessing the epitaxial channel 501, filling with a dielectric material 701, and planarizing the dielectric material 701. The epitaxial channel 501 is partially recessed to a level that is still within the dielectric capping layer 130 and over the second spacer 111. The epitaxial channel 501 is recessed by etching, for example, by a RIE or a wet etch process.

The recess formed over the recessed epitaxial channel 501 is filled with a dielectric material to form a dielectric cap on a distal end of the channel 501 and over the second spacer 111. The dielectric material 701 may be a dielectric oxide (e.g., silicon oxide), a dielectric nitride (e.g., silicon nitride), a dielectric oxynitride, or any combination thereof. The dielectric material 701 is deposited by a deposition process, for example, chemical vapor deposition (CVD) or physical vapor deposition (PVD). After deposition, the dielectric material 701 is planarized, by for example, CMP.

FIGS. 8A and 8B are a cross-sectional side view and a top view, respectively, after removing the dielectric capping layer 130 and forming an epitaxial growth 801 on a distal end of the epitaxial channel 501 to form a drain over the dummy gate 120 and second spacer 111. The epitaxial growth 801 of the drain is arranged between the dielectric material 701 and the epitaxial channel 501. The epitaxial growth 801 is also arranged between the dielectric cap and the dummy gate 120. A portion of the epitaxial channel 501 over the second spacer 111 may be recessed along sidewalls before forming the epitaxial growth 801. The epitaxial growth 801 forms the drain. In other embodiments, the epitaxial growth 801 forms the source. The epitaxial growth may be performed as described above in FIGS. 5A and 5B.

FIGS. 9A and 9B are a cross-sectional side view and a top view, respectively, after depositing a spacer 901 on the epitaxial growth 801. The spacer 901 protects the epitaxial growth 801 of the drain. The spacer 901 is also disposed on a sidewall of the dielectric material 701. The spacers 901 extend around the drain from the second spacer 111 to a surface of the dielectric material 701. The spacer 901 includes an insulating material, for example, dielectric oxides (e.g., silicon oxide), dielectric nitrides (e.g., silicon nitride), dielectric oxynitrides, or any combination thereof. The spacer 901 material is deposited by a deposition process, for example, chemical vapor deposition (CVD) or physical vapor deposition (PVD). The spacer material may be etched by a dry etch process, for example, a RIE process, such that it covers the epitaxial growth 801 and is removed from a surface of the dielectric material 701 and the second spacer 111. The spacer 901 has a width 902 (thickness) of about 5 to about 50 nm, or from about 15 to about 30 nm.

Figure 10B:
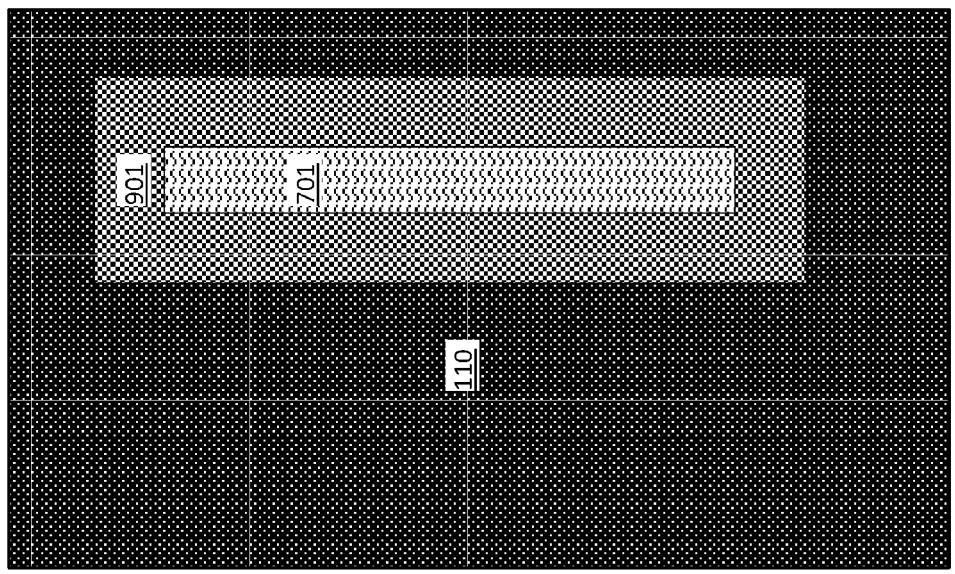
FIGS. 10A and 10B are a cross-sectional side view and a top view, respectively, after removing a portion of the second spacer and dummy gate.
Figure 10A:
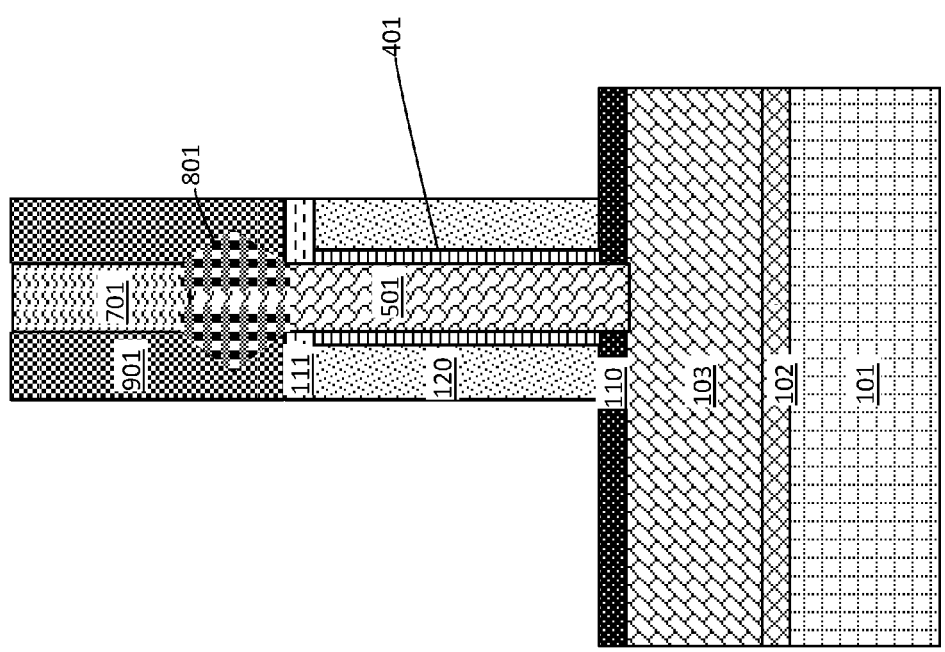

FIGS. 10A and 10B are a cross-sectional side view and a top view, respectively, after removing a portion of the second spacer 111 and dummy gate 120. The second spacer 111 and the dummy gate material 120 are recessed to remove portions that extend horizontally beyond the spacer 901 material. Portions of the dummy gate 120 remain arranged on sidewalls of the channel 501. An etch process that is selective to (will not substantially remove) the first spacer 110 is performed. The etch process may be a dry etch process, such as a RIE process. Lateral portions of the first spacer 110 are exposed.

Figure 11B:
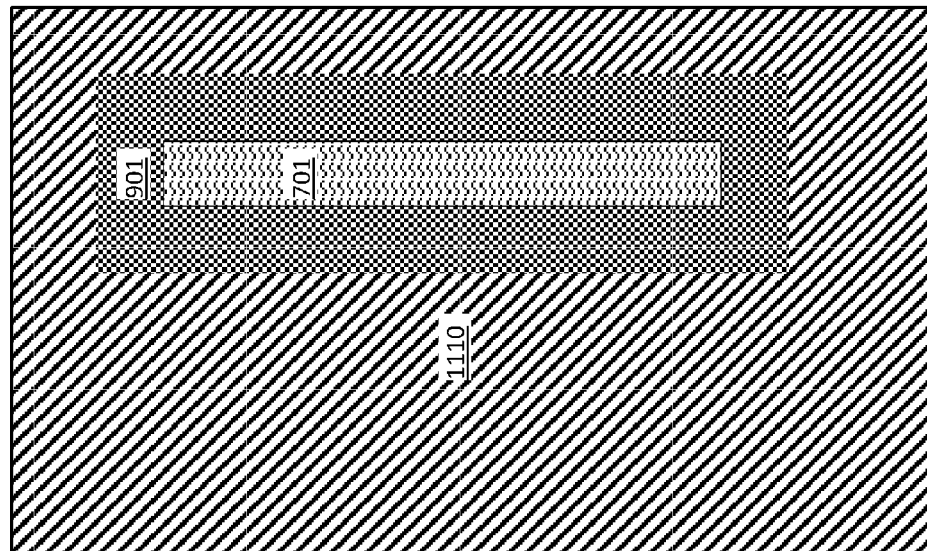
FIGS. 11A and 11B are a cross-sectional side view and a top view, respectively, after depositing an additional ultra-low-k spacer on the first spacer.
Figure 11A:
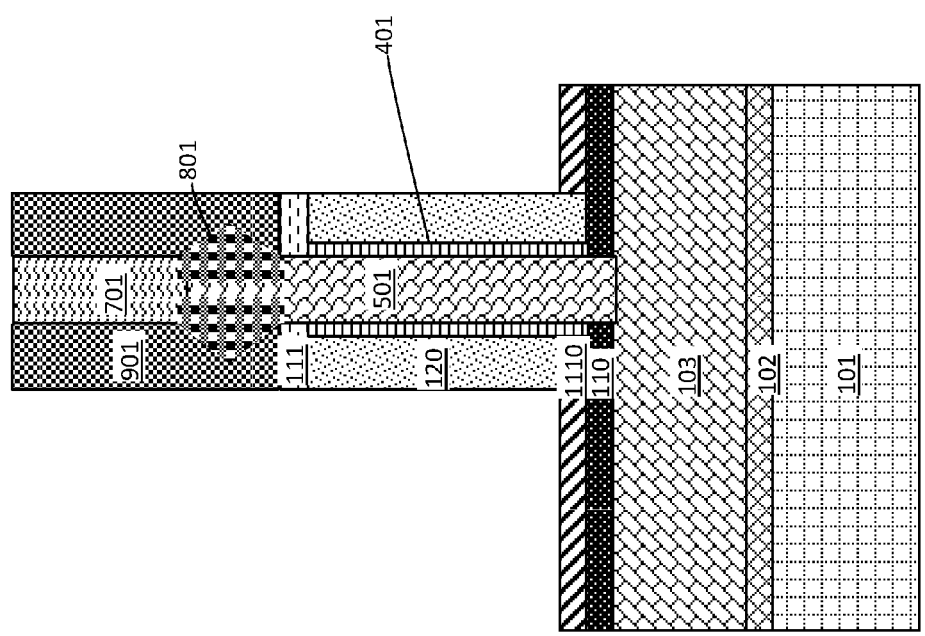

FIGS. 11A and 11B are a cross-sectional side view and a top view, respectively, after depositing an additional ultra-low-k spacer 1110 on the first spacer 110. The ultra-low-k spacer 1110 is deposited to thicken the spacer material layer outside the gate region, between the source and the drain. The ultra-low-k spacer 1110 also contacts sidewalls of the dummy gate 120.

Compared to the first spacer 110 layer, the ultra-low-k spacer 1110 is subjected to fewer processing steps. Therefore, the ultra-low-k spacer 1110 material can be a more sensitive and effective lower-k material. The ultra-low-k spacer 1110 has a k-value of less than 8 in some embodiments. The ultra-low-k spacer 1110 may have a k-value that is different than the first spacer 110 or a k-value that is less than the first spacer 110 (i.e., the first spacer 110 has a k-value that is greater than the ultra-low-k spacer 1110). The ultra-low-k spacer 1110 has a k-value of less than 7 in other embodiments. The ultra-low-k spacer 1110 material can be deposited by, for example, a spin-on process or by sequential deposition and recess processes. The ultra-low-k spacer 1110 has a thickness in a range from about 3 to about 15 nm, or from about 5 to about 10 nm.

Figure 12B:
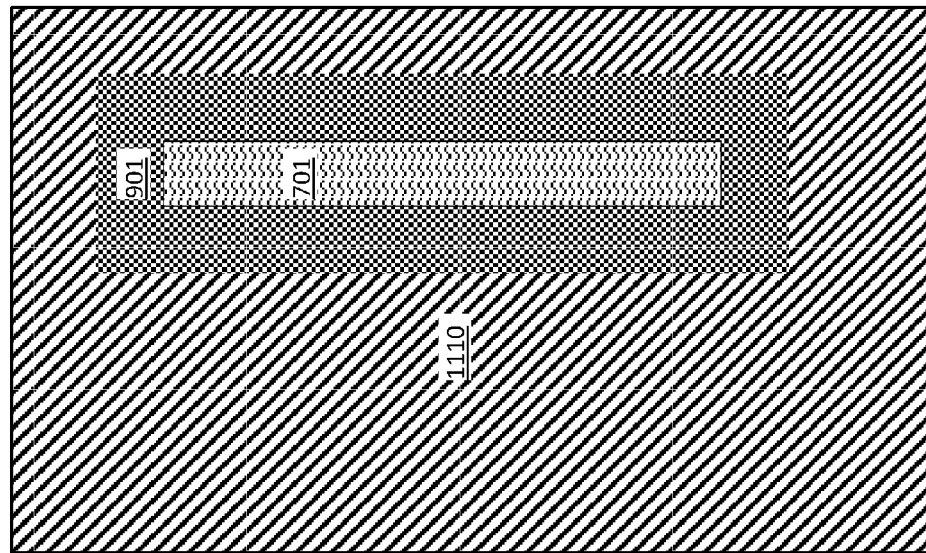
FIGS. 12A and 12B are a cross-sectional side view and a top view, respectively, after removing remaining portions of the dummy gate.
Figure 12A:
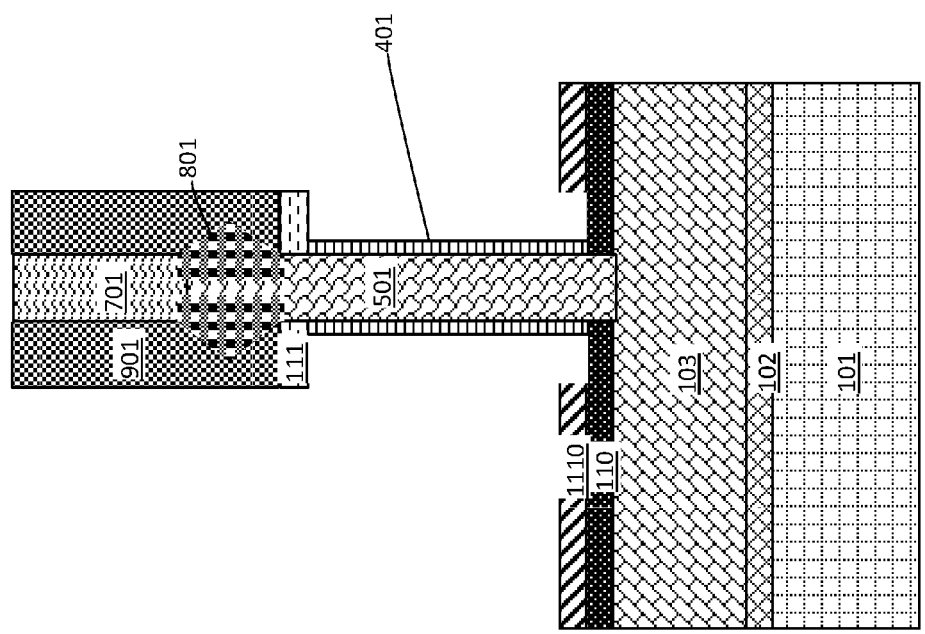

FIGS. 12A and 12B are a cross-sectional side view and a top view, respectively, after removing remaining portions of the dummy gate 120. Because the ultra-low-k spacer 1110 was deposited around the dummy gate 120, recesses are formed within the ultra-low-k spacer 1110 on opposing sidewalls of the channel 501. After removing the remaining dummy gate 120 material beneath the spacer 901, the oxide 401 is also exposed. The dummy gate 120 material may be removed by a wet etch process, for example, a process that includes hot ammonia.

Figure 13B:
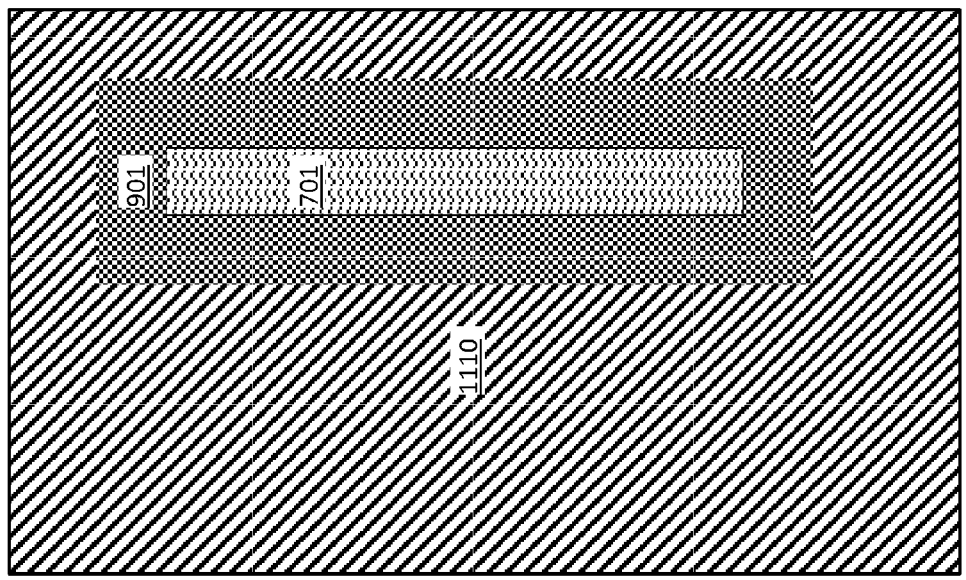
FIGS. 13A and 13B are a cross-sectional side view and a top view, respectively, after removing the dummy gate oxide layer and depositing a dielectric material and a work function metal.
Figure 13A:
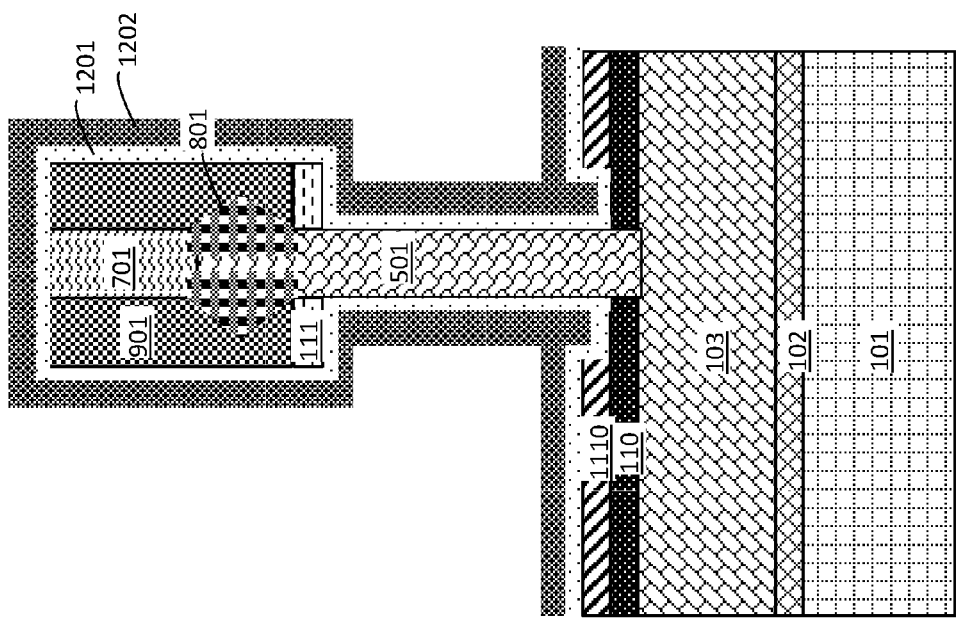

FIGS. 13A and 13B are a cross-sectional side view and a top view, respectively, after removing the dummy gate oxide 401 layer and depositing a dielectric material 1201 and a work function metal 1201. The dielectric material 1201 and the work function metal 1202 form a portion of the gate stack (metal gate) that replaces the dummy gate 120. Thus a portion of the gate stack is The gate dielectric material 1201 is first deposited. The gate dielectric material 1201 contacts the surface of the ultra-low-k spacer 1110 and portions of the first spacer 110 within the recesses adjacent to the channel 501. The gate dielectric material 1201 lines sidewalls of the recesses within the ultra-low-k spacer 1110. The work function metal 1202 is then deposited on the dielectric material 1201. The work function metal 1202 is also disposed within the recess formed in the ultra-low-k spacer 1110 adjacent to the channel 501. The dielectric material 1201 and work function metal 1202 line the sidewalls of the channel 501, with the dielectric material 1201 being in direct contact with the channel 501.

The gate dielectric material(s) can be a dielectric material having a dielectric constant greater than 3.9, 7.0, or 10.0. Non-limiting examples of suitable materials for the gate dielectric material 1201 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric material 1201 layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material 1201 may vary depending on the deposition process as well as the composition and number of high-k dielectric materials used.

The work function metal(s) 1202 may be disposed over the gate dielectric material 1201. The type of work function metal(s) 1202 depends on the type of transistor. Non-limiting examples of suitable work function metals 1202 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) 1202 may be deposited by a suitable deposition process, for example, CVD, PECVD, PVD, plating, thermal or e-beam evaporation, and sputtering.

Figure 14B:
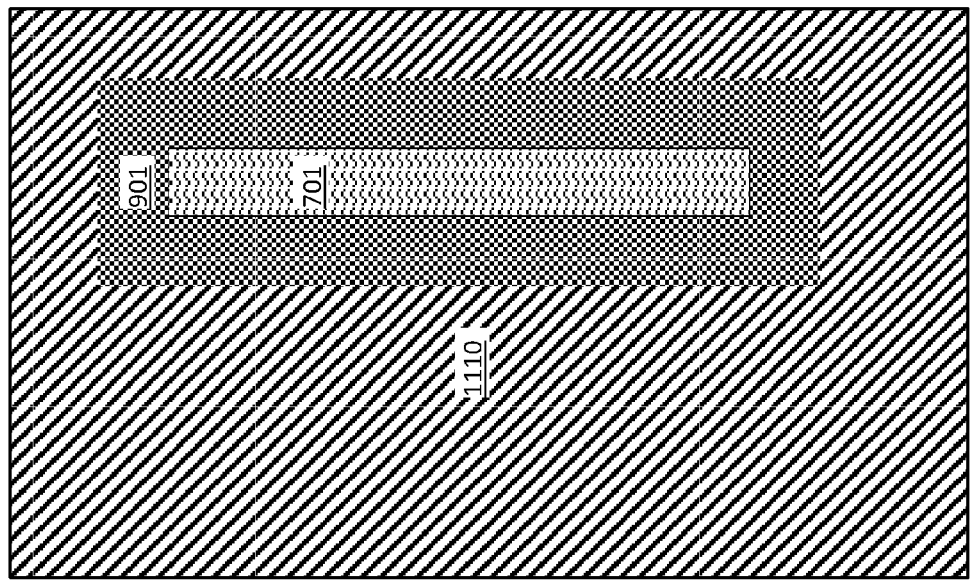
FIGS. 14A and 14B are a cross-sectional side view and a top view, respectively, after partially etching the dielectric material and work function metal.
Figure 14A:
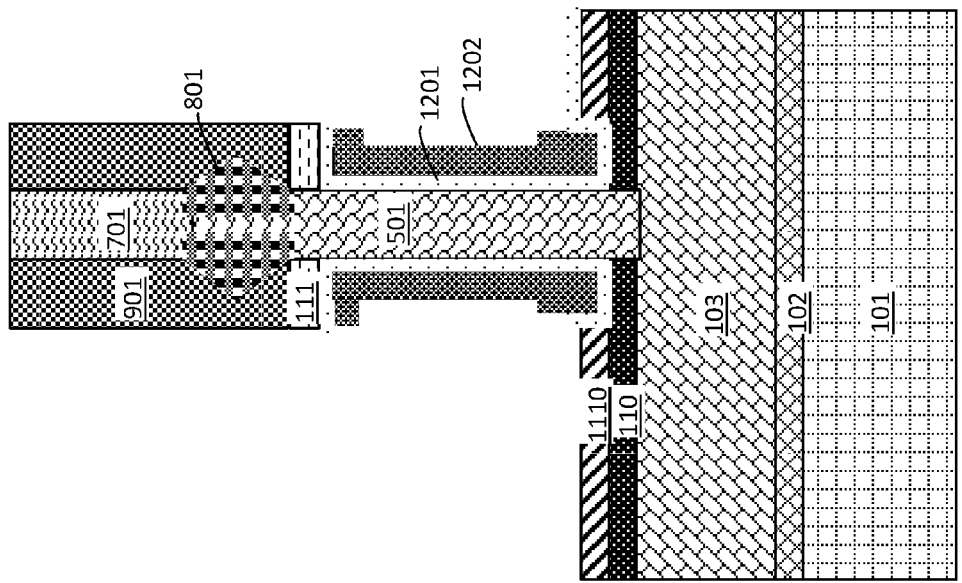

FIGS. 14A and 14B are a cross-sectional side view and a top view, respectively, after partially etching the dielectric material 1201 and work function metal 1202. An anisotropic etch is performed to remove the gate dielectric material 1201 and the work function metal 1202 from surfaces of the spacer 901 and dielectric material 701. The anisotropic etch may be a RIE process. After etching, the gate dielectric material 1201 and work function metal 1202 are confined to the region between the source and the drain.

Figure 15B:
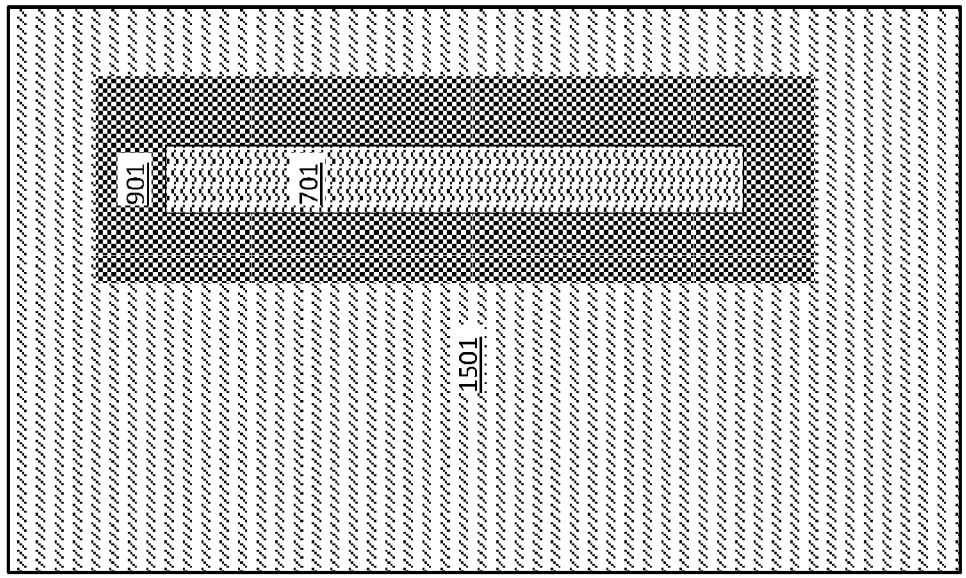
FIGS. 15A and 15B are a cross-sectional side view and a top view, respectively, after filling with a metal gate material and partially recessing the metal gate material.
Figure 15A:
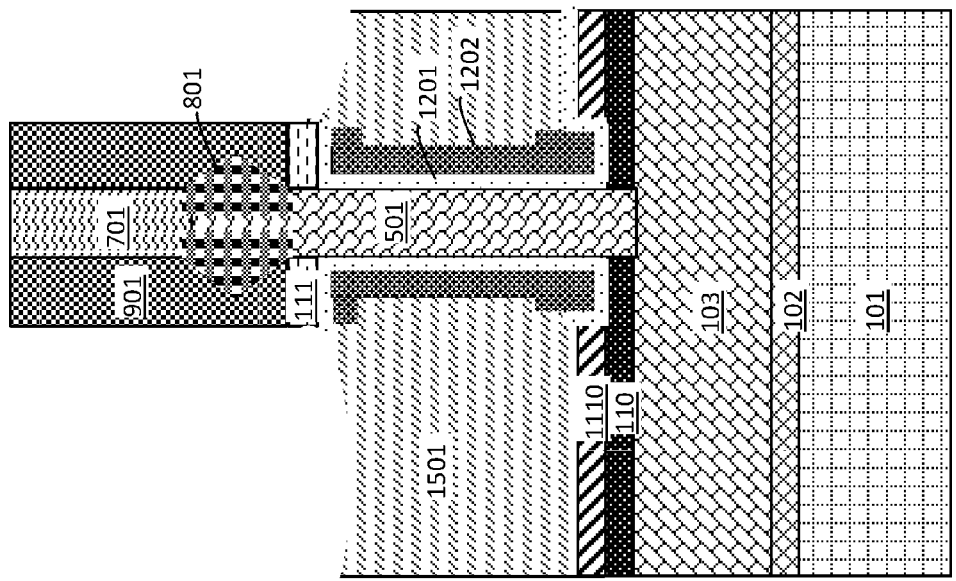

FIGS. 15A and 15B are a cross-sectional side view and a top view, respectively, after filling with a metal gate material 1501 and partially recessing the metal gate material 1501. The metal gate material 1501 is a conductive gate metal that is deposited over the gate dielectric material(s) 1201 and work function metals 1202 to form the gate stack. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, CMP, is performed to polish the surface of the conductive gate metal material 1501. After deposition, the metal gate material 1501 is partially recessed to a level below the epitaxial growth 801 forming the drain by an etch process, for example, a RIE process.

FIGS. 16A and 16B are a cross-sectional side view and a top view, respectively, after performing gate lithography and etching to form the gate. A portion of the ultra-low-k spacer 1110 is exposed. A mask may be disposed on the metal gate material 1501 and subsequently patterned. The pattern is transferred into the metal gate material 1501 to remove a portion of the metal gate material 1501 and define the final gate. In addition, the gate dielectric material 1201 and work function metal 1202 are also etched during this step. A combination of RIE processes may be performed. A portion of the first spacer 110 is arranged between the gate stack of the gate and the doped source 103. The gate replaces the dummy gate 120 and is arranged in contact with the channel 501.

Figure 17B:
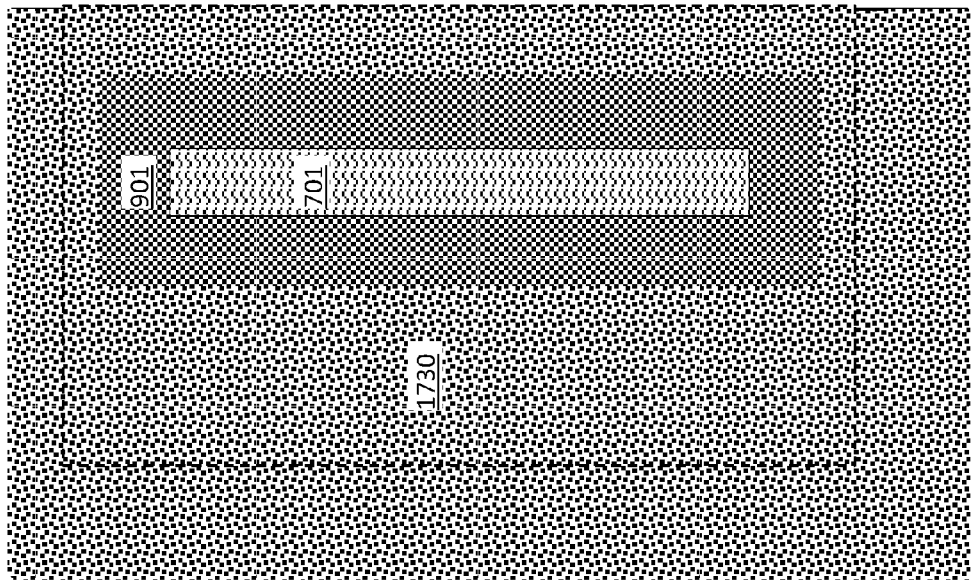
FIGS. 17A and 17B are a cross-sectional side view and a top view, respectively, after depositing an inter-layer dielectric (ILD) and planarizing.
Figure 17A:
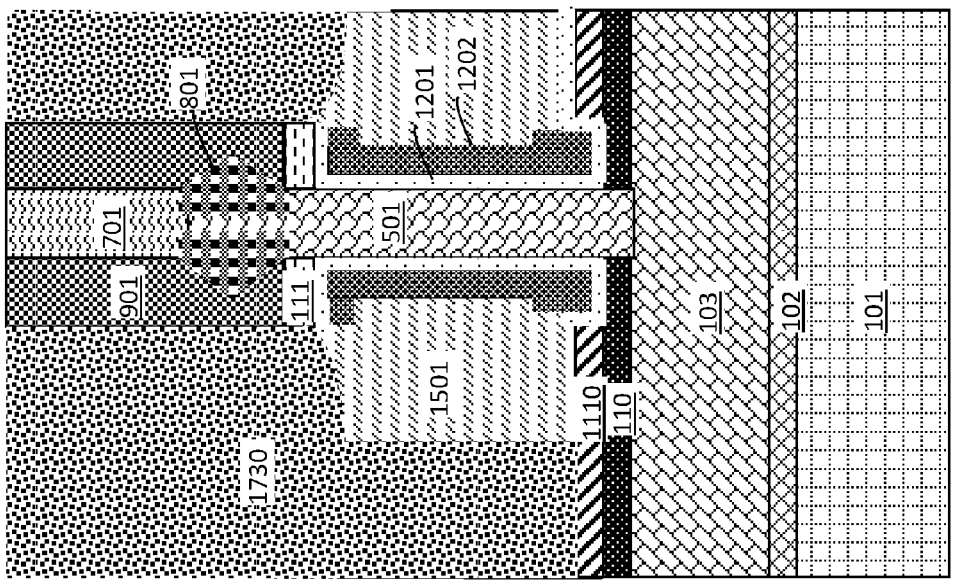

FIGS. 17A and 17B are a cross-sectional side view and a top view, respectively, after depositing an inter-layer dielectric (ILD) 1730 and planarizing. The ILD 1730 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 1730 is deposited by a deposition process, including, but not limited to CVD, PVD, plasma enhanced CVD, atomic layer deposition (ALD), evaporation, chemical solution deposition, or like processes.

FIGS. 18A and 18B are a cross-sectional side view and a top view, respectively, after forming source contacts 1840 over the doped source 103. It is noted that the source contacts 1840 are only shown in FIG. 18B, and not in FIG. 18A, because the source contacts 1840 are arranged at an end of the gate. The source contacts 1840 extend through the ILD 1730 and first spacer 110 to the doped source 103 and are formed within a trench. To remove the ILD 1730 and form the source trenches, a resist, such as a photoresist, may be deposited and patterned. An etch process, such as a ME, may be performed using the patterned resist as an etch mask to remove the ILD 1730 and first spacer 110 until the doped source 103 is exposed. The source trenches are filled with a conductive material or a combination of conductive materials. The conductive material filling may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 1730.

FIGS. 19A and 19B are a cross-sectional side view and a top view, respectively, after forming gate contacts 1950. The gate contacts 1950 extend from the surface of the ILD 1730 to the gate. The gate contacts 1950 are formed by patterning a trench in the ILD 1730. The trench extends from a surface of the ILD 1730 to the gate. To remove the ILD 1730 and form the gate contact trenches, a resist, such as a photoresist, may be deposited and patterned. An etch process, such as a ME, may be performed using the patterned resist as an etch mask to remove the ILD 1730 until the gate is exposed. The gate contact trenches are filled with a conductive material or a combination of conductive materials. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 1730.

Figure 20B:
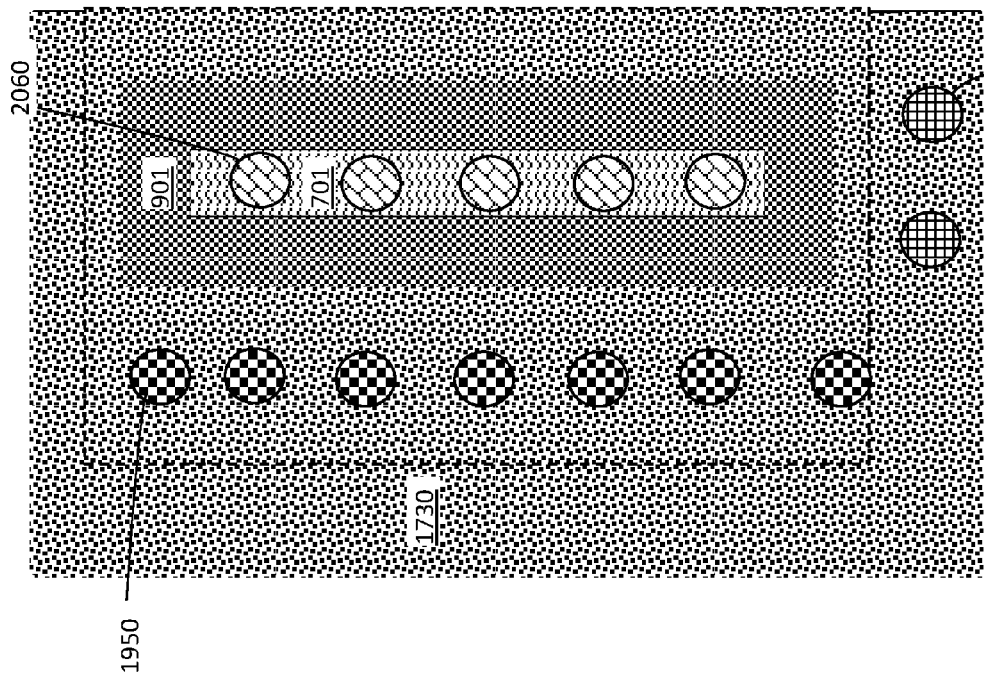
Figure 20A:
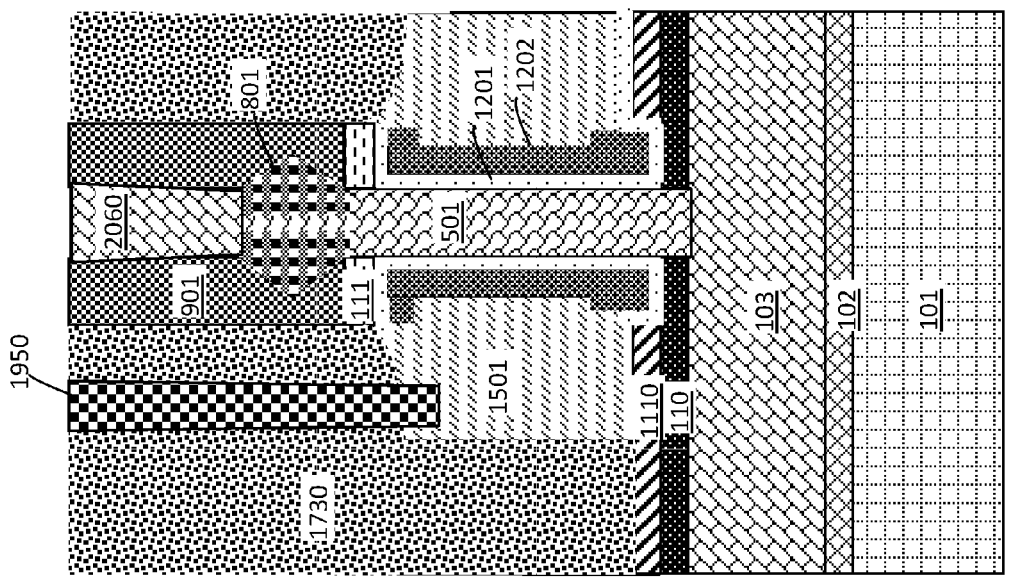

FIGS. 20A and 20B are a cross-sectional side view and a top view, respectively, after forming drain contacts 2060. To form the drain contacts 2060, the dielectric material 701 over the drain is removed by etching, and a contact metal is deposited in the resulting opening. Non-limiting examples of metals for the drain contacts 2060 include aluminum (Al), platinum (Pt), gold (Au), tungsten (W), titanium (Ti), or any combination thereof. The metal may be deposited by a suitable deposition process, for example, CVD, PECVD, PVD, plating, thermal or e-beam evaporation, or sputtering. A planarization process, for example, CMP, is performed to remove any conductive material from the surface of the ILD 1730.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertical transistor, comprising:
   a doped source layer arranged on a substrate;
   a gate spacer layer arranged directly on the doped source layer;
   an ultra-low-k spacer layer arranged directly on the gate spacer layer;
   a channel extending vertically from the doped source layer to a drain, the gate spacer layer directly contacting two sides of the channel;
   a recess formed within the ultra-low-k spacer layer that is adjacent to the channel; and
   a gate arranged on the doped source and in the recess within the ultra-low-k spacer layer, a bottom surface of the gate contacting the gate spacer layer, and sidewalls of the gate contacting the ultra-low-k spacer layer.

2. The vertical transistor of claim 1, wherein the doped source layer comprises a dopant incorporated into the substrate.

3. The vertical transistor of claim 2, further comprising a counter-doped layer arranged between the substrate and the doped source layer, the counter-doped layer comprising a dopant that is different than the dopant of the doped source layer.

* * * * *